United States Patent
Maxik et al.

(10) Patent No.: US 8,631,855 B2
(45) Date of Patent: Jan. 21, 2014

(54) SYSTEM FOR DISSIPATING HEAT ENERGY

(75) Inventors: Fredric S. Maxik, Indialantic, FL (US); David Henderson, Granville, OH (US); Valerie Bastien, Melbourne, FL (US)

(73) Assignee: Lighting Science Group Corporation, Satellite Beach, FL (US)

(*) Notice: Subject to any disclaimer, the term of this patent is extended or adjusted under 35 U.S.C. 154(b) by 1295 days.

(21) Appl. No.: 12/192,470

(22) Filed: Aug. 15, 2008

(65) Prior Publication Data

US 2010/0038053 A1    Feb. 18, 2010

(51) Int. Cl.
*F28D 17/00* (2006.01)
*F28D 19/00* (2006.01)
*F28D 15/00* (2006.01)

(52) U.S. Cl.
USPC .............. 165/10; 165/104.13; 165/104.14; 165/104.33

(58) Field of Classification Search
USPC ........ 165/10, 104.11, 104.13, 104.14, 104.33
See application file for complete search history.

(56) References Cited

U.S. PATENT DOCUMENTS

| | | | |
|---|---|---|---|
| 3,780,356 A | 12/1973 | Laing | |
| 4,003,426 A | 1/1977 | Best et al. | |
| 4,116,266 A | 9/1978 | Sawata et al. | |
| 4,238,759 A | 12/1980 | Hunsperger | |
| 4,257,556 A * | 3/1981 | Skala | 165/10 |
| 4,332,290 A | 6/1982 | Skala | |
| 4,412,528 A * | 11/1983 | Elzinga, Jr. | 126/618 |
| 4,446,916 A | 5/1984 | Hayes | |
| 4,709,752 A | 12/1987 | Schroder et al. | |
| 4,780,062 A | 10/1988 | Yamada et al. | |
| 5,007,478 A | 4/1991 | Sengupta | |
| 5,130,761 A * | 7/1992 | Tanaka | 257/88 |
| 5,222,362 A * | 6/1993 | Maus et al. | 60/527 |
| 5,263,323 A * | 11/1993 | Maus et al. | 604/67 |
| 5,505,706 A * | 4/1996 | Maus et al. | 604/131 |
| 5,508,884 A | 4/1996 | Brunet et al. | |
| 5,738,658 A * | 4/1998 | Maus et al. | 604/151 |
| 6,104,611 A | 8/2000 | Glover et al. | |
| 6,181,558 B1 | 1/2001 | Gordon | |
| 6,201,701 B1 | 3/2001 | Linden et al. | |
| 6,202,739 B1 | 3/2001 | Pal et al. | |
| 6,270,313 B1 | 8/2001 | Chuang et al. | |

(Continued)

FOREIGN PATENT DOCUMENTS

| | | |
|---|---|---|
| DE | 10200318 A1 | 7/2003 |
| EP | 1162659 A2 | 12/2001 |
| EP | 102004048031 A1 | 4/2006 |
| WO | 03046982 A1 | 6/2003 |

OTHER PUBLICATIONS

European Search Report for Application No. 09167601.5-filed Aug. 11, 2009; Mailing Date: Nov. 15, 2011; 5 pgs.

(Continued)

*Primary Examiner* — Ljiljana Ciric
(74) *Attorney, Agent, or Firm* — Cantor Colburn LLP

(57) ABSTRACT

A sustainable system for cooling at least one electronic device, for example a Light Emitting Diode (LED), and preferably a plurality of electronic devices, using at least one heat absorbing material contained within a housing that it is in thermal communication with the electronic devices. The heat absorbing materials may be present individually or in combinations thereof in order to achieve the desired heat absorption effect; the housing may include multiple chambers containing heat absorbing materials or combinations thereof.

8 Claims, 2 Drawing Sheets

(56) References Cited

U.S. PATENT DOCUMENTS

| | | | |
|---|---|---|---|
| 6,354,370 B1 * | 3/2002 | Miller et al. | 313/35 |
| 6,399,149 B1 * | 6/2002 | Klett et al. | 427/230 |
| 6,441,943 B1 | 8/2002 | Roberts et al. | |
| 6,444,496 B1 | 9/2002 | Edwards et al. | |
| 6,452,217 B1 | 9/2002 | Wojnarowski et al. | |
| 6,500,401 B2 * | 12/2002 | Reznek et al. | 423/445 R |
| 6,576,168 B2 * | 6/2003 | Hardcastle et al. | 264/29.1 |
| 6,631,755 B1 * | 10/2003 | Kung et al. | 165/104.14 |
| 6,639,356 B2 | 10/2003 | Chin | |
| 6,656,238 B1 * | 12/2003 | Rogers et al. | 44/620 |
| 6,656,239 B1 * | 12/2003 | Rogers et al. | 44/620 |
| 6,656,443 B2 * | 12/2003 | Klett | 423/445 R |
| 6,663,842 B2 * | 12/2003 | Klett | 423/448 |
| 6,673,328 B1 * | 1/2004 | Klett et al. | 423/445 R |
| 6,675,872 B2 * | 1/2004 | Lewis et al. | 165/10 |
| 6,848,500 B1 | 2/2005 | Langari et al. | |
| 7,118,563 B2 * | 10/2006 | Weckwerth et al. | 606/9 |
| 7,135,033 B2 * | 11/2006 | Altshuler et al. | 607/88 |
| 7,191,820 B2 * | 3/2007 | Chou et al. | 165/10 |
| 7,250,045 B2 * | 7/2007 | Island et al. | 606/17 |
| 7,316,262 B1 * | 1/2008 | Rini et al. | 165/10 |
| 7,316,265 B2 | 1/2008 | Searls et al. | |
| 7,452,356 B2 * | 11/2008 | Grove et al. | 606/9 |
| 7,505,268 B2 * | 3/2009 | Schick | 165/104.33 |
| 7,581,846 B2 * | 9/2009 | Hayman et al. | 362/119 |
| 7,863,641 B2 * | 1/2011 | Dahm | 257/99 |
| 8,159,821 B2 * | 4/2012 | Tan et al. | 165/104.33 |
| 8,511,342 B2 * | 8/2013 | Chiba et al. | 165/104.33 |
| 8,584,734 B2 * | 11/2013 | Shimozono | 165/10 |
| 2002/0033247 A1 * | 3/2002 | Neuschutz et al. | 165/10 |
| 2002/0144811 A1 * | 10/2002 | Chou et al. | 165/104.11 |
| 2005/0024834 A1 | 2/2005 | Newby | |
| 2011/0007445 A1 * | 1/2011 | Blakes | 165/10 |
| 2011/0057552 A1 * | 3/2011 | Weaver | 165/104.11 |
| 2011/0303946 A1 * | 12/2011 | Weaver et al. | 165/10 |
| 2012/0227926 A1 * | 9/2012 | Field et al. | 165/10 |

OTHER PUBLICATIONS

EP Office Action for EP Application No. 09 167 601.5-1232; Dated: Sep. 11, 2012; 5 pgs.

EP Office Action for EP Application No. 09 167 601.5-1803 Dated Jun. 25, 2013, pp. 1-8.

* cited by examiner

SYSTEM FOR DISSIPATING HEAT ENERGY

CROSS REFERENCE TO RELATED APPLICATIONS

Not applicable.

STATEMENT REGARDING FEDERALLY SPONSORED RESEARCH OR DEVELOPMENT

Not applicable.

INCORPORATION-BY-REFERENCE OF MATERIAL SUBMITTED ON A COMPACT DISK

Not applicable.

BACKGROUND OF THE INVENTION

1. Field of the Invention

The present invention generally relates to heat removal from an electronic device, more specifically, the present invention relates to at least one embodiment in which heat is removed from a Light Emitting Diode (LED), or a plurality of LEDs, by way of a thermal connection with a heat absorbing material which removes heat from the LED by undergoing an endothermic reaction.

2. Background Art

LED light sources are well known in the art. LEDs are light sources based upon a semiconductor structure, specifically a diode structure, which emit incoherent light (which may be in the ultraviolet, visible, or infrared spectrum) when electrical current is passed through the semiconductor junction. The original uses of LED light sources were in low-power applications such as indicator lights on instrumentation panels and the like. However, recent developments in LED technology have increased the output power and efficiency of LED sources so that it is now feasible to utilize them in traditional lighting applications previously reserved for incandescent, fluorescent, sodium, and similar lighting technologies. Commercially available LED light sources surpassed incandescent light source in terms of efficiency in or around 2002. More recently, LED light sources have become commercially available which exceed fluorescent light sources in efficiency. Fluorescent light sources typically exhibit around 75-100 lumens per Watt (lm/W) efficiency; however LED light sources have been recently introduced into the lab which exhibit 130 lm/W, and there are other LED light sources available and currently in development which exhibit even greater efficiency.

As the output power of the commercially available LED light sources has continued to improve, it has become necessary to develop methodologies and structures for removing the heat generated by the LED from the LED semiconductor junction. Typical problems caused by heating of the semiconductor junction and surrounding structure are: 1) failures brought on by such occurrences as non-homogenous distribution of the current density over the junction ("current crowding"), which causes a local hot spot in the diode junction leading to early failure due to thermal runaway; 2) nucleation and growth of dislocations in the active region of the diode in which the radiative recombination occurs due to the existence of an existing defect in the semiconductor crystalline structure and which is accelerated by heat; 3) degradation of materials utilized in the LED, such as phosphor or encapsulate, causing loss of efficiency and changes in output color; and 4) electromigration of metal atoms at the metallization layers of the diode causing growth of conductive "whiskers" and early failure. This is not a complete list of the undesired effects brought on by elevated temperatures; it is provided herein simply as a list of exemplary effects.

As an example of an LED that may be used in illumination see the LUXEON® products from Philips. The LUXEON® product line data sheets provide information for these products at 25°, or approximately room temperature. It is therefore desirable to operate these products and those like them as close to room temperature as possible. A heat conduction/dissipation apparatus is therefore required in such applications in order to remove heat from the LED in an effort to operate the LED as close to the data sheet temperature as practicable.

Attempts have been made to provide structure for removing the heat from the semiconductor junction of an LED. See, for example, U.S. Pat. No. 6,639,356 B2 (disclosing a heat dissipating base for an LED, and which further states the heat problem created by the use of LEDs in various applications, namely that " . . . Heat generated by LED (sic) becomes the largest drawback in LED manufacturing industry, which causes different malfunctions to the circuitry." U.S. Pat. No. 6,639,356 B2, col. 1. The invention of U.S. Pat. No. 6,639,356 B2 is an attempt to better conduct the heat away from the LED semiconductor junction so as to overcome the problems created by an overheated junction; namely reduced lifetime and output power. However, the invention of U.S. Pat. No. 6,639,356 B2 is directed to a package LED and simply providing a thermally conductive path out of the LED package. It does nothing to address the larger issue of dissipating heat away from the package.

There are a variety of means which have been employed to dissipate heat from packaged electronic devices. These means have met with limited success. One such means is simply to allow the heat from an electronic device to passively radiate from the electronic device package. This method allows the heat generated by the electronic device to radiate to the surrounding environment. This is not an efficient means of heat removal. In the case of LEDs, as the LED's capability to output light has increased over time, the power consumed by the LED has also increased. The increase in power consumed by the LED results in a corresponding increase in waste heat generated by the LED. Passive cooling of a high powered LED does not remove a sufficient amount of heat to enable the LED to operate as efficiently as possible. In order to facilitate optimum LED performance, more heat must be removed from a high power LED than can be removed by conventional passive methods.

An improvement to mere passive radiation is the use of a thermal grease or similar thermally conductive material. Such a thermally conductive material is used to enhance the thermal connection between the electronic device and the surface upon which the electronic device is mounted. See, for example U.S. Pat. No. 6,444,496 B1 (disclosing that "thermal paste is often used as a high thermal conductivity interface material to fill the gaps between the back-side of chips, such as, flip chips, and the inside surfaces of the caps or heat spreaders."). The use of such a thermally conductive material allows the heat from the electronic device to more readily radiate away from the electronic device and to be dissipated by the mounting surface. The use of a thermally conductive material to couple the electronic device to the mounting surface increases the ability of the electronic device package to radiate heat. However, in the case of high power LEDs, this method may not adequately remove the amount of heat necessary to achieve optimum LED performance.

Another passive means of providing for heat removal comprises mounting the electronic device on a circuit board which is designed to enhance thermal conductivity. See, for example, U.S. Pat. No. 6,201,701 (disclosing "[a]n integrated substrate comprising a heatsink base, and a multilayer circuit board bonded thereto, the multilayer circuit board having the capability to interconnect both power and control semiconductor elements and efficiently dissipate heat therefrom."). This method may dissipate more heat when compared to passive radiation of the electronic device package alone; however, the heat dissipation achieved by using circuit boards with enhanced thermal conductivity may still not be sufficient to enable the electronic device to achieve optimum performance. This is particularly true of high power LEDs.

Still another passive means of providing for heat removal from an electronic device is by use of a conventional heat sink. A conventional heat sink is typically constructed from a thermally conductive material which has a large surface area. See, for example, U.S. Pat. No. 6,441,943 B1 (disclosing "[a] passive heat sink including . . . a plurality of fins . . . . The fins have a large surface area to dissipate heat, which increases dissipation of heat from the LED lamp, thereby increasing the amount of power that can be applied to the LED lamp without damaging the LED lamp, which in turn increases the amount of light that the LED lamp can produce.") While conventional heat sinks allow for improved cooling when compared to cooling the electronic device without such a device, the cooling achieved by means of a conventional heat sink may not be adequate to allow the electronic device to achieve optimum performance, particularly when a high powered LED is utilized. Additionally, the increased bulk of the design added by a conventional heat sink because of the need to maximize the surface area of the conventional heat sink may be undesirable.

Alternative methods of heat removal that have been employed include active heat removal solutions. One such active heat removal solution involves the use of a conventional electrical direct current fan. See, for example U.S. Pat. No. 6,270,313 B1 (disclosing "a fan that is most commonly employed in cooling the electronic devices. The directions of the inlet and the outlet of the airflow are arranged in parallel. The blades of the fan are rotated along an axis perpendicular to the plane of the blades and in parallel to the airflow direction. This configuration produces a direct pressure difference between the inlet and outlet of the airflow thus provides large airflow for cooling and removing the heat generated from the electronic circuits."). There are multiple significant problems involved with using a conventional electrical direct current fan to cool an electronic device. The conventional electrical direct current fan may add an unwanted amount of bulk to the design. Additionally, the use of a conventional electrical direct current fan creates audible noise which may be undesirable to the electronic device application. Furthermore, the use of a fan to actively cool an electronic device may still not cool the electronic device sufficiently to achieve optimum performance of the electronic device. This is especially true in the case of high powered LEDs. Finally, the use of a fan may be undesirable because the fan must consume power to operate. This power consumption may reduce or even eliminate the power consumption benefits achieved by the use of high efficiency electronic devices, such as LEDs.

Another active method of heat removal which has been used is a piezo fan. See, for example, U.S. Pat. No. 4,780,062 (disclosing "[a] piezoelectric fan includes a tuning-fork type vibrator having two sides. A first piezoelectric element is formed on each of the two sides of the vibrator. Further, an exciting electrode is formed on each of these first piezoelectric elements. Also, a feedback electrode is formed on one of the first piezoelectric elements an electrically insulated from the exciting electrode. Furthermore, a blade is attached to the tip of each of the two sides of the vibrator. Then, this piezoelectric fan is driven in a self-exciting fashion by feeding an output from the feedback electrode to the exciting electrode."). However, a piezo fan must consume power in order to provide any cooling benefit to the electronic device. The use of a piezo fan may be undesirable because of this necessary power consumption. Additionally, piezo fans may be undesirable because of the increased bulk which they add to a design and the cooling obtained through the use of these fans may not be sufficient, particularly when used with high power LEDs.

Another active method of heat removal involves the use of a Peltier element. See, for example, U.S. Pat. No. 4,238,759 (disclosing "[a] Peltier-cooled p-n junction in a monolithic solid-state electronic device embodying a substrate comprising a Peltier thermal surface layer disposed adjacent the active region of the p-n junction and in close proximity therewith, the Peltier thermal surface layer having an electrical conductor in circuit therewith affording an electrical path for the withdrawal or supply of Peltier effect current incident to the maintenance of the junction at a preselected temperature."). Under certain limited conditions, a Peltier element may result in significant cooling of the electronic device. However, the Peltier element is extremely inefficient. The Peltier element requires the consumption of electricity to operate. In fact, the Peltier element may consume up to twice as much power as it dissipates. This increased power consumption is just one disadvantage to using a Peltier element. An additional disadvantage is that because of the inefficiency of the Peltier element, a significantly larger heat sink must be used to dissipate the additional heat created by the Peltier element. Furthermore, as the power transferred by the Peltier element increases, the temperature across the Peltier device tends to decrease; therefore, the use of a Peltier device may provide no cooling at all if the system in which it is used is high powered.

Another legacy means of active heat removal from an electronic device involves the use of a heat pipe. See, for example, U.S. Pat. No. 4,116,266 (disclosing "a closed container which is possessed of an input portion and an output portion for heat energy and is provided on the inside thereof with a wick extending throughout from the input portion to the output portion and disposed so that the resistance offered thereby to the flow of liquid gradually decreases from the input side to the output side. The heat medium which is vaporized on the input side is moved in the direction of the output side by virtue of the difference of pressure created inside the container. The heat medium which is deprived of heat and consequently liquefied on the output side is moved within the wick in the direction of the input side by virtue of capillary action coupled with the suction resulting from the vaporization of the heat medium in the input portion."). The use of a heat pipe may provide a more efficient method of removing heat from an electronic device when compared to some passive methods; however, there are still drawbacks to this type of cooling system. The use of a heat pipe may be undesirable because the physical size of the heat pipe must be large enough to allow space for the material to vaporize and move away from the heat source. Additionally, the heat pipe may not remove as much heat from the electronic device as is required to achieve optimum performance, particularly in the case of high power LEDs.

Still another means of removing heat from an electronic device involves the use of a material which can only be used as a means of heat removal for a limited period of time. See, for example, U.S. Pat. No. 7,135,033 B2 (disclosing that "ice is employed as a phase change material for removing waste heat generated by a light source incorporated in a handpiece of a photocosmetic device."). This may be an efficient means of heat removal until the material has exhausted its heat absorbing capabilities. At this point, the desirable thermal characteristics of the material are depleted and no further heat dissipation can be effected. In addition to the limited duration of such a solution, this solution is undesirable because it is not sustainable. That is, when this kind of a material has been depleted, it cannot automatically be renewed. A new amount of the heat dissipating material would have to be added to the system in order for the material to provide continuing heat dissipation functions.

Attempts have been made to address the problem of removing heat from electronic devices. See, for example, U.S. Pat. No. 6,202,739 B1 (disclosing a heat-dissipating apparatus which "includes a housing piece that includes a sealed chamber and a phase change material disposed within the sealed chamber. The heat-dissipating apparatus is thermally coupled to the heat-generating component and provides for heat dissipation by an endothermic process of changing phase from solid to liquid, thereby lowering the operating temperature of the heat-generating component." U.S. Pat. No. 6,202,739 B1). However, the invention of U.S. Pat. No. 6,202,739 B1 does not address the use of phase change materials or other materials that may undergo endothermic reactions other than organic paraffin compounds, including n-eicosene, n-octadecan, and n-dotriacontane, low-temperature solder alloy, and a low-temperature metal, such as gallium.

See also, for example, U.S. Pat. No. 6,452,217 B1 (disclosing an LED lamp in which "phase change material is incorporated into the lamp to act as a source of heat removal." U.S. Pat. No. 6,452,217 B1). However, the invention of U.S. Pat. No. 6,452,217 B1 discloses only the use of phase change materials, including waxes and eutectic salts, and discloses only that these materials are impregnated in a metal mesh or other metal structure. Furthermore, U.S. Pat. No. 6,452,217 B1 does not disclose the use of additional endothermic reactions, nor does it disclose the use of these materials in a form which is not embedded in a metal component of some sort.

See also, for example, U.S. Pat. No. 3,780,356 (disclosing "[a] device for cooling a semiconductor component comprising a chamber enclosing a non-metallic crystal forming material which experiences a phase change at a temperature which corresponds to the desired operating temperature of the semiconductor component and wherein the material is in thermal communication with the semiconductor component." U.S. Pat. No. 3,780,356). However, U.S. Pat. No. 3,780,356 discloses only the use of hydrates of the inorganic salts of alkali or alkali earth metals, eutectics of the chlorides, nitrates, acetates, or ammoniates of the light metals.

See also, for example, U.S. Pat. No. 5,508,884 (disclosing a "[s]ystem for dissipating heat energy generated by an electronic component and sealed enclosure used in a system of this kind. The system for dissipating heat of the invention is of the type comprising a sealed metal enclosure the interior volume of which contains a fluid, said component being fixed to the outside wall of said enclosure and connected to a heat dissipator by said enclosure and is characterized in that the phase change temperature of the fluid at atmospheric pressure is less than a given maximum ambient temperature and in that said enclosure also contains a volume of gas different from the fluid so that variation in the ambient temperature causes a variation in the pressure inside the enclosure which modifies the phase change temperature of the fluid." U.S. Pat. No. 5,508,884). However, the invention of U.S. Pat. No. 5,508,884 does not disclose the use of any material other than phase change liquid.

It is apparent from the aforementioned prior art that there is no known way to provide an efficient and sustainable means of sufficient heat removal from electronic devices without burdening the design with increased power consumption or bulk. It is therefore desirable that electronic device cooling technology provide cooling which is efficient, in that it does not require any power consumption, and capable of dissipating large enough quantities of heat to allow the electronic device to achieve optimum performance while adding only minimal bulk to the design.

BRIEF SUMMARY OF THE INVENTION

The present invention solves the aforementioned problems in the art by providing for heat dissipation from electronic devices, including, but not limited to, LEDs, by the use of a variety of materials that will undergo endothermic reactions upon reaching a desired temperature, which reactions are reversible when the electronic devices are no longer generating heat so that the system of providing heat removal is self sustaining.

One embodiment of the invention provides an electronic device, or a plurality of electronic devices, in thermal communication with a heat absorbing material that will undergo an endothermic reaction upon reaching a desired temperature. These heat absorbing materials include, but are not limited to organic paraffin compounds, such as n-octadecane, low-temperature solder alloy, low-temperature metal, neicosane, muriatic acid, stearic acid, acetamide, wax, eutectic alloy of bismuth, eutectic allow or lead, eutectic alloy of tin, eutectic salt, alkali metals, hydrates of the inorganic salts of alkali, eutectics of the chlorides, nitrates, acetates, ammoniates of the light metals. Additionally, the heat absorbing material may be microencapsulated. Furthermore, the heat absorbing material may be contained in a thermally conductive container.

Another embodiment of the invention provides an electronic device, or a plurality of electronic devices, in thermal communication with a plurality of heat absorbing materials that may undergo an endothermic reaction upon reaching a desired temperature. The use of more than one heat absorbing material may increase the temperature range over which the invention provides heat dissipation, and further may provide a customized heat absorption profile.

Additionally, when the heat absorbing materials are stored in a container, the pressure of the heat absorbing materials may be tuned so that the heat absorbing materials absorb heat from the electronic devices at the temperature which will ensure optimum performance of the electronic devices.

The present invention is not limited to being comprised of heat absorbing materials which undergo a phase change; any heat absorbing materials which dissipate heat by way of an endothermic reaction may be used.

DETAILED DESCRIPTION OF THE INVENTION

Although the following detailed description contains many specifics for the purposes of illustration, anyone of ordinary skill in the art will appreciate that many variations and alterations to the following details are within the scope of the invention. Accordingly, the following preferred embodiments of the invention are set forth without any loss of generality to, and without imposing limitations upon, the claimed invention.

Figure 1:
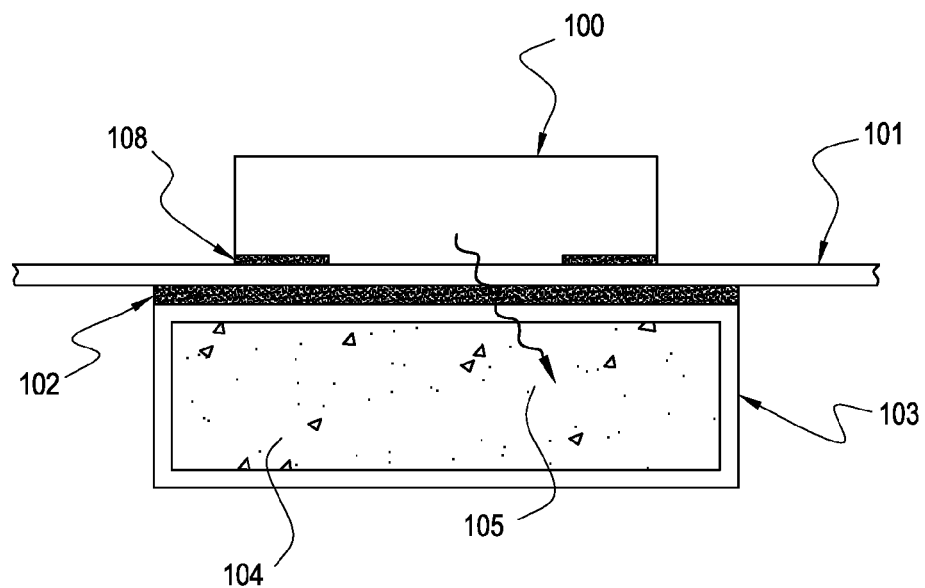
FIG. 1 depicts an embodiment of the present invention comprising an electronic device and an enclosed chamber containing heat absorbing material.

Referring now to FIG. 1, there is illustrated an electronic device 100 mounted on a PCB 101. The electronic device 100 is thermally and physically connected to the PCB 101 by way of a first thermal/structural bond 108. The PCB 101 is thermally and physically connected to a housing 103 by way of a second thermal/structural bond 102. The housing 103 contains heat absorbing material 104 which is used as a means of heat transfer 105 from the electronic device 100.

The electronic device 100 may be any device which generates heat and includes LEDs, organic light emitting diodes (OLEDs), resistors, transistors, exciters, amplifiers, diodes, semiconductors, and other electronic devices known in the art. In FIG. 1 the electronic device is depicted as an LED.

The first thermal/structural bond 108 is depicted in FIG. 1 as accomplished by means of solder applied to solder pads for a surface mounted electronic device 100. However, the first thermal/structural bond 108 may be accomplished by other means known in the art, such as, for example, through hole solder connections. Additionally, a thermally conductive material such as, for example, thermal grease, may be utilized to improve the thermal communication of the thermal/structural bond 108.

An endothermic reaction is a chemical reaction during which there is absorption of heat which cools the surroundings. An endothermic material is a material which undergoes an endothermic reaction at a given temperature. The heat absorbing material 104 may be any endothermic material, or any combination of endothermic materials. In the preferred embodiment, the heat absorbing material 104 absorbs heat energy by endothermic reaction, which process is reversible. A reversible endothermic reaction is a reaction in which the heat absorbing material 104 will return to its original characteristics when the heat transfer 105 is complete.

The heat absorbing material 104 may be a phase change material. A phase change material is a material that absorbs heat by changing from one phase to another. A phase change material may absorb heat by any of the following phase transitions: solid-solid, solid-liquid, solid-gas, liquid-gas. The heat absorbing material 104 may include any of the following phase change materials: an organic paraffin compound, n-octadecane, low-temperature solder alloy, low-temperature metal, neicosane, muriatic acid, stearic acid, acetamide, wax, a eutectic alloy of bismuth, a eutectic alloy of lead, an eutectic alloy of tin, eutectic salt.

Additionally, the heat absorbing material 104 may be an ion crystal forming material. The heat absorbing material 104 may include any of the following ion crystal forming materials: an alkali metal, a hydrate of the inorganic salts of alkali, a hydrated salt, a eutectic of the chlorides, a nitrate, an acetate, and an ammoniate of the light metals.

The heat absorbing material 104 may include only a single endothermic material or any combination of endothermic materials. The heat absorbing material 104 may be microencapsulated.

Figure 2:
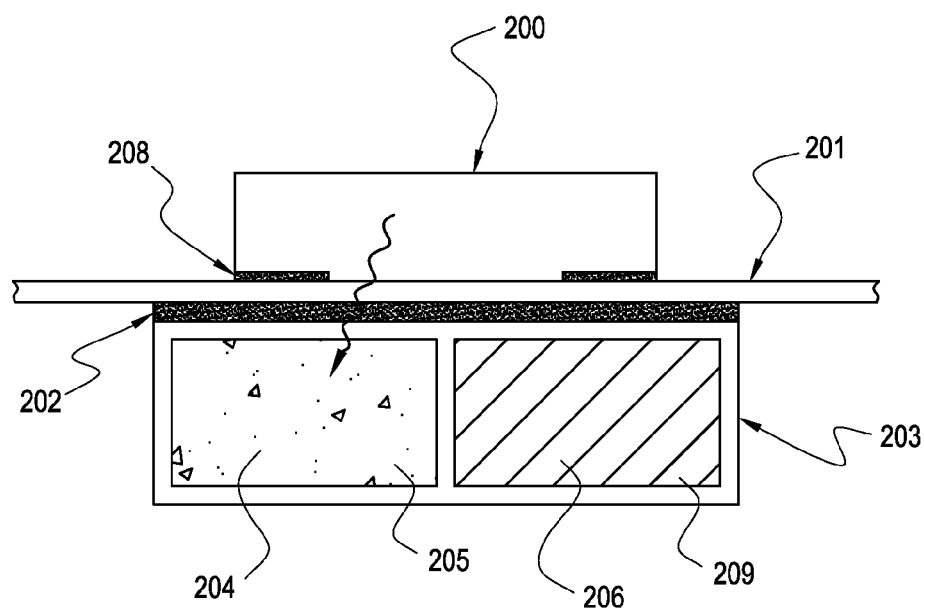
FIG. 2 depicts an embodiment of the present invention comprising an electronic device and an enclosed housing comprised of multiple chambers containing heat absorbing material.

Referring now to FIG. 2, there is illustrated an electronic device 200 mounted on a PCB 201. The electronic device 200 is thermally and physically connected to the PCB 201 by way of a first thermal/structural bond 208. The PCB 201 is thermally and physically connected to a housing 203 by way of a second thermal/structural bond 202. The housing 203 contains a first heat absorbing material 204 which is a means for a first heat transfer 205 and a second heat absorbing material 206 which is a means for a second heat transfer 209 from the electronic device 200.

The housing 203 is a thermally conductive structure which contains a first heat absorbing material 204 and a second heat absorbing material 206. The first heat absorbing material 204 may be the same as the second heat absorbing material. Alternatively, the first heat absorbing material 204 may be different than the second heat absorbing material 206. The first heat absorbing material 204 and the second heat absorbing material 206 may have different phase change temperatures. The first heat absorbing material 204 may have a lower phase change temperature than the second heat absorbing material 206 so that the total cooling system is effective over a wider range of temperatures. The housing 203 may contain multiple chambers. In FIG. 2 the housing 203 is depicted with two chambers, one chamber is filled with a first heat absorbing material 204 and the other chamber is filled with a second heat absorbing material 206. However, the housing 203 may contain more than two chambers. In embodiments in which the housing 203 contains more than two chambers, each chamber may be filled with a different heat absorbing material.

Figure 3:
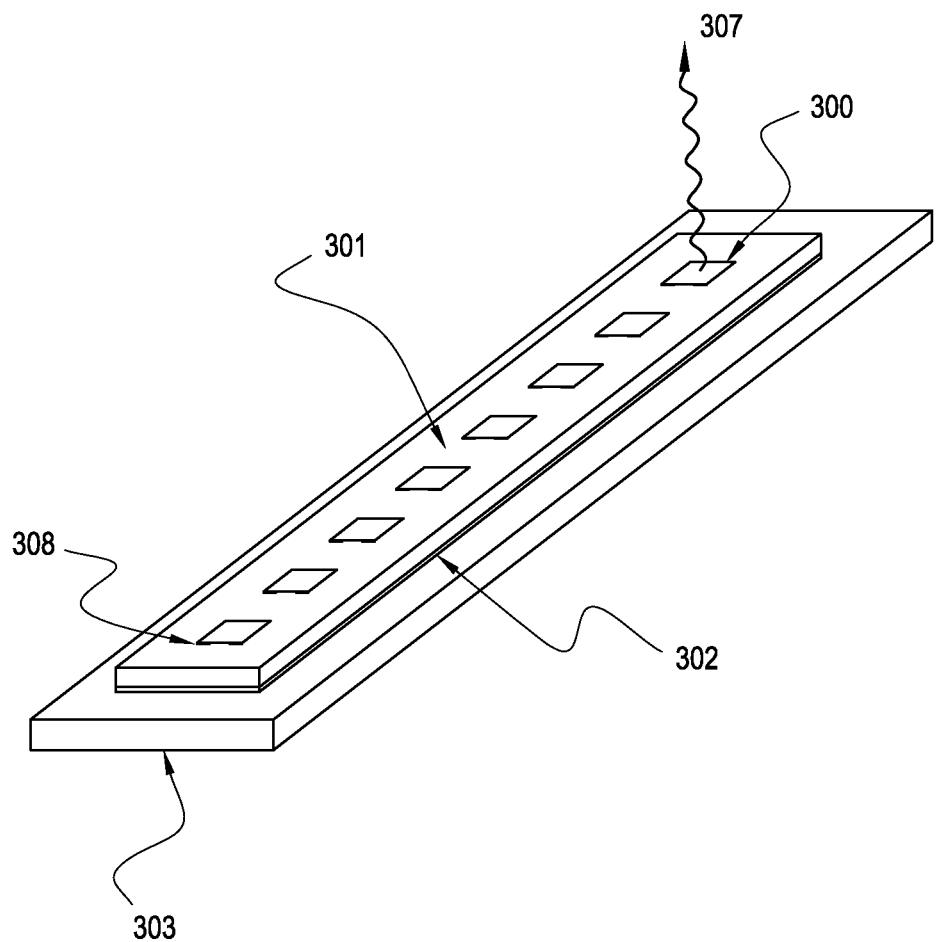
FIG. 3 depicts an embodiment of the invention comprising a plurality of electronic devices mounted to a printed circuit board (PCB) substrate, and an enclosed chamber containing heat absorbing material.

Referring now to FIG. 3, there is illustrated an electronic device 300, more specifically, an LED, mounted on a PCB 301. The electronic device 300 is thermally and physically connected to the PCB 301 by way of a first thermal/structural bond 308. The PCB 301 is thermally and physically connected to a housing 303 by way of a second thermal/structural bond 302. The housing 303 contains heat absorbing material which is used as a means of heat transfer from the electronic device.

FIG. 3 shows a plurality of electronic devices 300 mounted on the PCB 301. In FIG. 3, all of the electronic devices 300 are depicted as LEDs. However, the electronic devices 300 may be any number and combination of electronic devices that are known in the art. Additionally, it is understood that the housing 303 may have multiple chambers which contain heat absorbing material. The heat absorbing material dispersed within the housing 303 may be selected so that the melting temperature of the heat absorbing material corresponds to the optimum operating temperature of the particular electronic device 300 which the heat absorbing material cools.

Accordingly the reader will see that, according to one embodiment of the invention, the present invention provides for an LED mounted on a circuit board and thermally connected to a housing. The housing may contain any number of chambers, each of which may be filled with a heat absorbing material or left empty. The heat absorbing materials will provide heat dissipation to the LED to allow the LED to operate at optimum operating temperature.

While the above description contains much specificity, these should not be construed as limitations on the scope of any embodiment, but as exemplifications of the presently preferred embodiments thereof. Many other ramifications and variations are possible within the teachings of the various embodiments.

Thus the scope of the invention should be determined by the appended claims and their legal equivalents, and not by the examples given.

What is claimed is:

1. A system for dissipating heat energy comprising:
   at least one electronic device;
   at least one housing, wherein said at least one housing is in thermal communication with said at least one electronic device; and
   at least one first heat absorbing material and at least one second heat absorbing material contained within said at least one housing;
   wherein said at least one housing comprises a first chamber and a second chamber, said first chamber containing said at least one first heat absorbing material and said second chamber containing said at least one second heat absorbing material.

2. The system of claim 1, wherein said at least one first heat absorbing material and said at least one second heat absorbing material are independently selected from the group consisting of an organic paraffin compound, n-octadecane, low-temperature solder alloy, low-temperature metal, neicosane, muriatic acid, stearic acid, acetamide, wax, a eutectic alloy of bismuth, a eutectic alloy of lead, an eutectic alloy of tin, eutectic salt, an alkali metal, a hydrate of the inorganic salts of alkali, a hydrated salt, a eutectic of the chlorides, a nitrate, an acetate, and an ammoniate of the light metals.

3. The system of claim 1, wherein said at least one electronic device comprises an LED.

4. The system of claim 1, wherein at least one of said at least one first heat absorbing material and said at least one second heat absorbing material comprises a phase change material.

5. The system of claim 1, wherein at least one of said at least one first heat absorbing material and said at least one second heat absorbing material comprises an ion crystal forming material.

6. The system of claim 1, wherein at least one of said at least one first heat absorbing material and said at least one second heat absorbing material comprises a material selected from the group consisting of an organic paraffin compound, n-octadecane, low-temperature solder alloy, low-temperature metal, neicosane, muriatic acid, stearic acid, acetamide, wax, a eutectic alloy of bismuth, a eutectic alloy of lead, an eutectic alloy of tin, eutectic salt, an alkali metal, a hydrate of the inorganic salts of alkali, a hydrated salt, a eutectic of the chlorides, a nitrate, an acetate, and an ammoniate of the light metals.

7. The system of claim 6, wherein said at least one first heat absorbing material and said at least one second heat absorbing material comprises two or more heat absorbing materials.

8. The system of claim 1, wherein at least one of said at least one first heat absorbing material and said at least one second heat absorbing material comprises a microencapsulated material.

* * * * *